United States Patent
Gebuhr et al.

(10) Patent No.: US 9,515,015 B2
(45) Date of Patent: Dec. 6, 2016

(54) HOUSING FOR AN ELECTRONIC COMPONENT, AN ELECTRONIC ASSEMBLY, METHOD OF PRODUCING A HOUSING FOR AN ELECTRONIC COMPONENT AND METHOD OF PRODUCING AN ELECTRONIC ASSEMBLY

(71) Applicant: OSRAM Opto Semiconductors GmbH, Regensburg (DE)

(72) Inventors: Tobias Gebuhr, Regenburg (DE); Thomas Schwarz, Regensburg (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 123 days.

(21) Appl. No.: 14/423,835

(22) PCT Filed: Aug. 28, 2013

(86) PCT No.: PCT/EP2013/067773
§ 371 (c)(1),
(2) Date: Feb. 25, 2015

(87) PCT Pub. No.: WO2014/033150
PCT Pub. Date: Mar. 6, 2014

(65) Prior Publication Data
US 2015/0221585 A1 Aug. 6, 2015

(30) Foreign Application Priority Data
Aug. 31, 2012 (DE) .................. 10 2012 215 449

(51) Int. Cl.
*H01L 23/495* (2006.01)
*H01L 23/498* (2006.01)
(Continued)

(52) U.S. Cl.
CPC ..... *H01L 23/49586* (2013.01); *H01L 21/4839* (2013.01); *H01L 23/49861* (2013.01);
(Continued)

(58) Field of Classification Search
CPC ..... H01L 23/495–23/49596; H01L 23/49861; H01L 23/28–23/3192; H01L 21/56–21/568; H01L 21/4821–21/4842; H01L 23/49586; H01L 21/4839; H01L 33/486; H01L 51/5212; H01L 51/5228; H01L 33/647; H01L 2224/48247; H01L 2224/48471; H01L 2924/12044; H01L 2933/0033; Y10T 29/49121
USPC ................... 438/112, 123, 124, 127
See application file for complete search history.

(56) References Cited

U.S. PATENT DOCUMENTS 6,168,970 B1    1/2001  Burns
6,501,156 B1 *  12/2002 Nakanishi ......... H01L 23/49503
                                                   257/432
(Continued)

FOREIGN PATENT DOCUMENTS

EP    1 603 158 A1   12/2005
JP    06-224244      8/1994
(Continued)

OTHER PUBLICATIONS

English translation of a Notice to File a Response dated Feb. 1, 2016 of corresponding Korean Application No. 10-2015-7007943.
(Continued)

*Primary Examiner* — Scott B Geyer
(74) *Attorney, Agent, or Firm* — DLA Piper LLP (US)

(57) ABSTRACT

A housing includes a lead frame formed from electrically conductive material having first and second sides, a contact section contacting an electronic component at the first side, and at least one receiving section arranging the electronic component at the first side, wherein the contact and receiving sections are separated and the contact section is formed thinner than the receiving section in a direction perpendicular, a molding material having an opening, the receiving and contact regions exposed in the opening, and into which the leadframe is embedded such that part of the molding material is formed between the contact and receiving sections and the second side is covered by the molding material in the contact section, and the second side is free of molding material in the receiving section, wherein the molding material at the second side has at least one opening filled with the electrically insulating material.

10 Claims, 5 Drawing Sheets (51) Int. Cl.
*H01L 33/48* (2010.01)
*H01L 21/48* (2006.01)
*H01L 51/52* (2006.01)
*H01L 33/64* (2010.01)

(52) U.S. Cl.
CPC ........... *H01L33/486* (2013.01); *H01L 33/647* (2013.01); *H01L 51/5212* (2013.01); *H01L 51/5228* (2013.01); *H01L 2224/48247* (2013.01); *H01L 2224/48471* (2013.01); *H01L 2924/12044* (2013.01); *H01L 2933/0033* (2013.01); *Y10T 29/49121* (2015.01)

(56) References Cited

U.S. PATENT DOCUMENTS

| | | | |
|---|---|---|---|
| 6,821,822 B1 * | 11/2004 | Sato | H01L 21/565 257/678 |
| 7,208,772 B2 * | 4/2007 | Lee | H01L 33/647 257/100 |
| 7,282,785 B2 * | 10/2007 | Yoshida | H01L 33/62 257/666 |
| 7,521,294 B2 | 4/2009 | Lee | |
| 7,749,797 B2 * | 7/2010 | Bauer | H01L 31/0203 257/433 |
| 8,044,418 B2 * | 10/2011 | Loh | H01L 33/483 257/666 |
| 8,134,173 B2 * | 3/2012 | Kamamori | H01L 33/483 257/99 |
| 8,941,134 B2 * | 1/2015 | Loh | H01L 33/483 257/93 |
| 2001/0022390 A1 * | 9/2001 | Waitl | H01L 31/0203 257/666 |
| 2003/0168720 A1 * | 9/2003 | Kamada | B29C 45/14655 257/666 |
| 2006/0043401 A1 | 3/2006 | Lee et al. | |
| 2006/0157726 A1 | 7/2006 | Loh et al. | |
| 2007/0262328 A1 * | 11/2007 | Bando | H01L 24/97 257/79 |
| 2008/0012036 A1 * | 1/2008 | Loh | H01L 33/483 257/99 |
| 2008/0023714 A1 | 1/2008 | Chae et al. | |
| 2008/0042151 A1 | 2/2008 | Oh et al. | |
| 2009/0283781 A1 | 11/2009 | Chan et al. | |
| 2010/0127294 A1 | 5/2010 | Chen et al. | |
| 2011/0163433 A1 | 7/2011 | Toda et al. | |
| 2012/0025361 A1 * | 2/2012 | Ito | H01L 23/047 257/676 |

FOREIGN PATENT DOCUMENTS

| | | |
|---|---|---|
| JP | 09-116051 | 5/1997 |
| JP | 2009-194057 | 8/2009 |
| JP | 2011-91311 | 5/2011 |
| JP | 2011-146611 A | 7/2011 |

OTHER PUBLICATIONS

English translation of Japanese Notification of Reasons for Refusal dated May 30, 2016, of corresponding Japanese Application No. 2015-529000.

* cited by examiner

HOUSING FOR AN ELECTRONIC COMPONENT, AN ELECTRONIC ASSEMBLY, METHOD OF PRODUCING A HOUSING FOR AN ELECTRONIC COMPONENT AND METHOD OF PRODUCING AN ELECTRONIC ASSEMBLY

TECHNICAL FIELD

This disclosure relates to a housing for an electronic component. The disclosure furthermore relates to an electronic assembly, a method of producing a housing for an electronic component and a method of producing an electronic assembly.

BACKGROUND

DE 10 2012 215 449.3 forms part of this disclosure and describes a housing for an electronic component, an electronic assembly, a method of producing a housing for an electronic component and a method of producing an electronic assembly.

Known housings for electronic components, for example, QFN (quad flat no leads) housings, comprise leadframe sections, for example, as basic material. The QFN housings are also designated as QFN packages and/or as micro leadframe (MLF) and are known in electronics as a chip housing design for integrated circuits (IC). The designation "QFN" encompasses different sizes of IC housings which can all be soldered as surface-mounted devices on printed circuit boards.

SUMMARY

We provide a housing for an electronic component including a leadframe section formed from an electrically conductive material has a first side and a second side facing away from the first side, a contact section having a contact region that electrically contacts the electronic component at the first side, and at least one receiving section having a receiving region that arranges the electronic component at the first side, wherein the contact section and the receiving section are physically separated from one another and wherein the contact section is formed such that it is thinner than the receiving section in a direction perpendicular to the first side, a molding material having a receiving opening, the receiving region and the contact region being exposed in the receiving opening, and into which the leadframe section is embedded such that a part of the molding material is formed between the contact section and the receiving section and the second side of the leadframe section is covered by the molding material in the region of the contact section, and the second side of the leadframe section is free of molding material in the region of the receiving section, wherein the molding material at the second side of the leadframe section in the region of the contact section has at least one opening filled with an electrically insulating material.

We also provide an electronic assembly including an electronic component and including the housing for an electronic component including a leadframe section formed from an electrically conductive material has a first side and a second side facing away from the first side, a contact section having a contact region that electrically contacts the electronic component at the first side, and at least one receiving section having a receiving region that arranges the electronic component at the first side, wherein the contact section and the receiving section are physically separated from one another and wherein the contact section is formed such that it is thinner than the receiving section in a direction perpendicular to the first side, a molding material having a receiving opening, the receiving region and the contact region being exposed in the receiving opening, and into which the leadframe section is embedded such that a part of the molding material is formed between the contact section and the receiving section and the second side of the leadframe section is covered by the molding material in the region of the contact section, and the second side of the leadframe section is free of molding material in the region of the receiving section, wherein the molding material at the second side of the leadframe section in the region of the contact section has at least one opening filled with an electrically insulating material, wherein the electronic component is arranged on the receiving region and is electrically coupled to the contact region.

We further provide a method of producing a housing for an electronic component including providing a leadframe section having a first side and a second side facing away from the first side, a contact section having a contact region that electrically contacts the electronic component at the first side, and at least one receiving section having a receiving region that arranges the electronic component at the first side, wherein the contact section and the receiving section are physically separated from one another and wherein the contact section is formed such that it is thinner than the receiving section in a direction perpendicular to the first side, embedding the leadframe section into a molding material such that the molding material has a receiving opening, in which the receiving region and the contact region remain free of molding material, but a part of the molding material is formed between the contact section and the receiving section and the second side of the leadframe section is covered by the molding material in the region of the contact section, and the second side of the leadframe section remains free of molding material in the region of the receiving section, wherein a molding tool having a first molding body and a second molding body is used to embed the leadframe section into the molding material, the leadframe section to be embedded is arranged between the first and second molding bodies such that the first side of the leadframe section faces the first molding body and the second side of the leadframe section faces the second molding body, the second molding body in the region of the contact section has at least one first molding element, the height of which is greater than or equal to a difference between the thickness of the leadframe section in the contact region and the thickness of the leadframe section in the receiving section, the first and second molding bodies are pressed together as a result of which the first molding element presses the contact section against the first molding body, the molding material is supplied between the two molding bodies, and an opening is formed in the molding material by the first molding element.

We also further provide a method of producing an electronic assembly, wherein a housing is produced for an electronic component including providing a leadframe section having a first side and a second side facing away from the first side, a contact section having a contact region that electrically contacts the electronic component at the first side, and at least one receiving section having a receiving region that arranges the electronic component at the first side, wherein the contact section and the receiving section are physically separated from one another and wherein the contact section is formed such that it is thinner than the receiving section in a direction perpendicular to the first side, embedding the leadframe section into a molding material such that the molding material has a receiving opening, in which the receiving region and the contact region remain free of molding material, but a part of the molding material is formed between the contact section and the receiving section and the second side of the leadframe section is covered by the molding material in the region of the contact section, and the second side of the leadframe section remains free of molding material in the region of the receiving section, wherein a molding tool having a first molding body and a second molding body is used to embed the leadframe section into the molding material, the leadframe section to be embedded is arranged between the first and second molding bodies such that the first side of the leadframe section faces the first molding body and the second side of the leadframe section faces the second molding body, the second molding body in the region of the contact section has at least one first molding element, the height of which is greater than or equal to a difference between the thickness of the leadframe section in the contact region and the thickness of the leadframe section in the receiving section, the first and second molding bodies are pressed together as a result of which the first molding element presses the contact section against the first molding body, the molding material is supplied between the two molding bodies, and an opening is formed in the molding material by the first molding element, and wherein an electronic component is arranged in the receiving region and is electrically coupled to the contact region.

DETAILED DESCRIPTION

In this description, the designation "QFN" is also used as representative of the following designations: MLPQ (Micro Leadframe Package Quad), MLPM (Micro Leadframe Package Micro), MLPD (Micro Leadframe Package Dual), DRMLF (Dual Row Micro Leadframe Package), DFN (Dual Flat No-lead Package), TDFN (Thin Dual Flat No-lead Package, UTDFN (Ultra Thin Dual Flat No-lead Package), XDFN (eXtreme thin Dual Flat No-lead Package), QFN-TEP (Quad Flat No-lead package with Top Exposed Pad), TQFN (Thin Quad Flat No-lead Package), VQFN (Very Thin Quad Flat No Leads Package). As an essential feature and in contrast to the similar Quad Flat Package (QFP), the electrical connections (pins) do not project laterally beyond the dimensions of the plastic enclosure, but rather are integrated in the form of non-tin-plated copper connections into the underside of the housing in a planar fashion. As a result, the required space on the printed circuit board can be reduced and a higher packing density can be achieved.

The leadframe sections are singulated from leadframes. The leadframes comprise or are formed from an electrically conductive material, for example. The electrically conductive material comprises, for example, a metal, for example, copper, for example, CuW or CuMo, copper alloys, brass, nickel and/or iron, for example, Fe—Ni, and/or is formed therefrom.

The leadframe sections serve, for example, to mechanically fix and/or electrically contact electronic components such as, for example, chips, for example, semiconductor chips and/or components that emit electromagnetic radiation. For this purpose, the leadframe sections have at a first of their sides, for example, receiving regions that receive the electronic components and/or contact regions that electrically contact the electronic components. The electrical contacting of the housing and the electronic components arranged therein is carried out via a second side of the leadframe sections facing away from the first side such that each leadframe section can be used both as carrier and as electrical contact and/or electrical conductor.

The electronic components can be surface-mounted components (surface mounted device, SMD), for example. SMD components, in contrast to components in through hole technology (THT), the "wired components," have no wire connections, but rather are soldered directly onto the receiving regions of the leadframe sections by solderable connection areas. This is carried out, for example, in accordance with known surface mounting (surface mounting technology, SMT).

During production of the housings, the leadframes are embedded into a molding material, for example, in a molding method, for example, an injection molding or transfer molding method. The molding material can be a plastic enclosure. The structure comprising molding material and the leadframe embedded therein can also be designated as a housing arrangement having a plurality of interconnected housings. The fact that the leadframes or leadframe sections are embedded into the molding material means, for example, that the leadframes or the leadframe sections are at least partly surrounded by the molding material. Parts of the leadframes can remain free of molding material, for example, at the second side of the leadframes the electrical connections that contact the housings, in particular the leadframe sections of the housings, and/or at the first side of the leadframe sections the receiving openings, in which the receiving regions and/or contact regions are exposed. The electrical contacts of the housings are formed at an opposite side of the leadframe sections relative to the receiving regions such that the finished housings can be placed onto a printed circuit board and the electrical contact with the leadframe and/or a thermal coupling of the housing to the printed circuit board can also be produced directly by the resultant physical contact between housing and printed circuit board.

For various applications, for example, for a QFN package comprising an electronic component having its two electrical contacts at its top side, for example, a side which emits electromagnetic radiation, it is desirable to have a bondable contact area on the first side of the leadframe section, which is electrically insulated from an underside of the QFN housing, the side which is partly formed by the second side of the leadframe section. As a result, as an alternative to the SMD components, electronic components having their electrical contacts at the top side could also be arranged and electrically contacted in a QFN housing, such that the electrical customer interface is provided on the top side of the corresponding QFN package. Such electronic components could be CoB (chip on board) components, for example.

We provide a housing for an electronic component and an electronic assembly which make it possible to mount an electronic component onto an electrically conductive leadframe section of the housing and to electrically contact the electronic component and nevertheless to electrically insulate the housing and respectively the electronic assembly toward an underside and/or to place the housing and respectively the electronic assembly onto an electrically conductive heat sink.

The housing comprises a leadframe section and a molding material. The leadframe section is formed from an electrically conductive material and has a first side and a second side facing away from the first side. The leadframe section has an contact section having a contact region for electrically contacting the electronic component at the first side. The leadframe section has at least one receiving section having a receiving region for arranging the electronic component at the first side. The contact section and the receiving section are physically separated from one another. The molding material has a receiving opening, the receiving region and/or the contact region being exposed in the receiving opening. The leadframe section is embedded into the molding material such that a part of the molding material is formed between the contact section and the receiving section.

We provide a method of producing a housing for an electronic component and/or a method of producing an electronic assembly which make it possible, in a simple manner, to produce the housing and/or the electronic assembly such that despite the use of an electrically conductive leadframe section for the housing, the housing and/or the electronic assembly are/is electrically insulated toward an underside and/or that the housing and/or the electronic assembly can be placed onto an electrically conductive heat sink and/or the housing can be produced precisely.

We provide a housing for an electronic component which may comprise a leadframe section and a molding material. The leadframe section is formed from an electrically conductive material and has a first side and a second side facing away from the first side. The leadframe has a contact section having a contact region for electrically contacting the electronic component at the first side. The leadframe section has at least one receiving section having a receiving region for arranging the electronic component at the first side. The contact section and the receiving section are physically separated from one another. The contact section is thinner than the receiving section in a direction perpendicular to the first side. The molding material has a receiving opening, the receiving region and/or the contact region being exposed in the receiving opening. The leadframe section is embedded into the molding material such that a part of the molding material is formed between the contact section and the receiving section and that the second side of the leadframe section is covered by the molding material in the region of the contact section and is free of molding material in the region of the receiving section.

The fact that the contact section is covered by molding material at the second side makes it possible to electrically contact an electronic component in the contact region and nevertheless to electrically insulate the housing from the electronic component in the contact section toward an underside of the housing facing away from the receiving region and the contact region. If an electronic component is connected which is electrically insulated at its side facing the receiving region or which is arranged on the receiving region by an insulating layer, then the entire leadframe section and thus the housing is electrically insulated toward its underside. This makes it possible, despite the electrically conductive leadframe section and despite the electrical contacting at the leadframe section, to place the housing onto an electrically conductive mounting area, for example, an electrically conductive area of a printed circuit board and/or an electrically conductive heat sink. The direct physical contact between the leadframe section and the heat sink can contribute to particularly effective dissipation of heat.

The molding material can comprise, for example, a plastic, for example, a synthetic resin, for example, epoxy resin, PPA, PCT, LCP, PEER, silicone or hybrids of these materials. The electronic component can be, for example, a component that emits electromagnetic radiation. The component that emits electromagnetic radiation can, for example, emit the electromagnetic radiation directly or firstly couple it into a conversion element which converts the electromagnetic radiation and then emits converted electromagnetic radiation. The electronic component can be a chip-on-board (CoB) element, for example, in which both electrical contacts of the electronic component are arranged on a side of the electronic component facing away from the leadframe section and in which the electronic component is electrically insulated toward the receiving region.

The molding material at the second side of the leadframe section in the region of the contact section and the leadframe section at the second side of the leadframe section in the region of the receiving section may form a planar area. By way of example, the molding material in the contact section and the receiving section form an underside of the housing. The housing can then be placed at its underside, for example, onto a printed circuit board and/or a heat sink, wherein a thermal contacting of the housing can be carried out at the underside of the housing by the molding material and/or the receiving section. Since the receiving section, in the receiving region, can be directly coupled to the electronic component, this can contribute to a particularly good thermal coupling of the electronic component toward the printed circuit board and/or the heat sink.

The molding material at the second side of the leadframe section in the region of the contact section may have at least one opening. The opening is filled with electrically insulating material. The opening can arise, for example, by a molding element having the effect that the contact section bears precisely against the corresponding molding body during the embedding, even though its thickness is less than the thickness of the receiving section. The electrically insulating material makes it possible still to provide the housing with an electrically insulated underside, in particular in the contact section, even though the housing has the opening.

The opening can thus contribute, for example, during a production process for producing the housing, to pressing the contact region in the contact section precisely onto a molding body of a molding tool. This has the effect that during the embedding of the leadframe section into the molding material, no molding material advances to the contact region.

Advancing the molding material into the contact region can also be designated as "flash." The flash can contribute to the situation that in the contact region the electronic component can be electrically contacted only imprecisely or cannot be electrically contacted at all. The flash must then often be removed in a subsequent process. Preventing the flash contributes to simple and precise formation of the housing, since then the electronic component can be electrically contacted as desired and the subsequent process of removing the flash can be dispensed with or the process of removing the flash can be simplified.

The opening may be partly filled with a molding element of the contact section and partly with the electrically insulating material. This can contribute, for example, to providing the molding element for pressing the contact section against the first molding body in a simple manner since this can be formed, for example, by a prominence of the contact section itself. The prominence can then be at least partly removed after the embedding of the leadframe section and the remaining opening can be filled with the electrically insulating material such that the housing is still electrically insulated toward its underside at the contact section.

An electronic assembly comprising an electronic component and comprising a housing may be provided, for example, one of the electronic components explained above and/or the housing explained above. The electronic component is arranged on the receiving region and electrically coupled to the contact region. The electronic component can be embedded into a potting compound, for example, in the receiving opening. The molding material can form a frame for the potting compound. The electronic component can be electrically insulated at its side facing the receiving region.

By way of example, the electronic component can have an electrically insulating substrate and can be arranged on the receiving region via the substrate. Alternatively or additionally, an electrically insulating layer can be formed between the electronic component and the receiving region. By way of example, electronic component parts of the electronic component can be applied on the electrically insulating substrate. The electronic component parts and the substrate then form the electronic component. The substrate can comprise aluminum nitride, aluminum oxide or sapphire, for example.

A method of producing a housing for an electronic component first includes providing a leadframe section formed from an electrically conductive material and has a first side and a second side facing away from the first side. The leadframe section has a contact section having a contact region that electrically contacts the electronic component at the first side. The leadframe section has at least one receiving section having a receiving region to arrange the electronic component at the first side. The contact section and the receiving section are physically separated from one another. The contact section is embedded such that it is thinner than the receiving section in a direction perpendicular to the first side. The leadframe section is embedded into a molding material such that the molding material has a receiving opening, the receiving region and the contact region remaining free of molding material in the receiving opening, that a part of the molding material is formed between the contact section and the receiving section, and that the second side of the leadframe section is covered by the molding material in the region of the contact section and remains free of molding material in the region of the receiving section. The molding material arranged between the contact section and the receiving section electrically insulates the contact section from the receiving section. Equally, the molding material formed at the second side of the contact section insulates the contact section and/or the contact region toward an underside of the housing.

The molding material may be formed such that the molding material at the second side of the leadframe section in the region of the contact section and the leadframe section at the second side in the receiving section form a planar area. By way of example, the molding material in the contact section and the second leadframe section in the receiving section form an underside of the housing. The housing can be placed onto a printed circuit board, for example, at its underside, wherein a thermal contacting of the housing can be carried out at the underside of the housing by the molding material in the contact section and/or by the leadframe section in the receiving section.

A molding tool having a first molding body and a second molding body may be used to embed the leadframe section into the molding material. The leadframe section to be embedded is arranged between the first and second bodies such that the first side of the leadframe section faces the first molding body and the second side of the leadframe section faces the second molding body. The second molding body, in the region of the contact section, has at least one first molding element, the height of which is greater than or equal to a difference between the thickness of the leadframe section in the contact section and the thickness of the leadframe section in the receiving section. The first and second molding bodies are pressed together, as a result of which the first molding element presses the contact section against the first molding body. The molding material is supplied between the two molding bodies. An opening is formed in the molding material by the molding element. The molding material is supplied to the molding body, for example, in a liquid and/or viscous state and can subsequently be cured, for example, dried.

The first molding element has the effect that the contact section, despite its small thickness, is pressed precisely against the first molding body such that no liquid molding material can penetrate between the contact section and/or the contact region and the first molding body during the embedding. In this case, the leadframe section can be used without modification. Without the first molding element, the molding tool could not seal the contact region relative to the molding material since no counterpressure would act from the side of the second molding tool. This would lead to deposition of molding material on the contact region and/or to formation of flash, which can lead to problems in subsequent processes, for example, during contacting, for example, during wire contacting of the electronic component. The first molding element thus contributes to precise formation of the housing, for example, without molding material and/or flash on the contact region. Alternatively or additionally, the positional and/or dimensional fidelity can be improved as a result.

The height of the molding element may be greater than the difference between the thickness of the leadframe section in the contact section and the thickness of the leadframe section in the receiving section. When the two molding bodies are pressed together, the contact section at the second side of the leadframe section is deformed. This can contribute to a particularly high pressure being exerted on the second contact section during embedding against the second molding body. Deformation can be inelastic and/or permanent, for example, such that an impression of the first molding element arises in the contact section by virtue of the first molding element.

In addition to one first molding element, even further first molding elements can be formed on the second molding body. By way of example, the first molding elements can be formed and arranged such that they are distributed uniformly over the contact section and press the latter uniformly against the first molding body. The first molding elements can have a sharp and/or pointed pressure section, for example, at which the corresponding first molding element presses against the contact section. By way of example, the first molding elements can be pyramidal, conical or wedge-shaped, wherein the vertex of the cone, of the wedge or of the pyramid respectively constitutes the pressure section and, during embedding, presses against the contact section and, if appropriate, leaves a corresponding impression in the contact section.

A molding tool having a first molding body and a second molding body may be used to embed the leadframe section into the molding material. At least one second molding element, the height of which is greater than or equal to a difference between the thickness of the leadframe section in the contact section and the thickness of the leadframe section in the receiving section, is arranged onto the second molding body. The leadframe section to be embedded is arranged between the first and second molding bodies such that the first side of the leadframe section faces the first molding body and the second side of the leadframe section faces the second molding body and that the second molding element is arranged in the region of the contact section. The first and second molding bodies are pressed together, as a result of which the second molding element presses the contact section against the first molding body. The molding material is supplied between the two molding bodies. An opening is formed in the molding material by the second molding element. The second molding element can be arranged as an alternative or in addition to the first molding element.

The second molding element has the effect that the contact section, despite its smaller thickness, is pressed precisely against the first molding body such that during embedding no liquid molding material can penetrate between the contact section and/or the contact region and the first molding body. In this case, the leadframe section and the molding tool, in particular the second molding body, can be used without modification. Without the second molding element, the molding tool could not seal the contact region relative to the molding material since no counterpressure would act from the side of the second molding tool. This would lead to deposition of molding material on the contact region and/or to formation of flash, which can lead to problems in subsequent processes, for example, during contacting, for example, during wire contacting of the electronic component. The second molding element thus contributes to precise formation of the housing, for example, without molding material and/or flash on the contact region. Alternatively or additionally, the positional and/or dimensional fidelity can be improved as a result.

The second molding element can press the contact section uniformly against the first molding body. As an alternative or in addition to one second molding element, even further second molding elements can be arranged on the second molding body. By way of example, the second molding elements can be formed and arranged such that they are distributed uniformly over the contact section and press the latter uniformly against the first molding body. The second molding elements can be elastic, for example. By way of example, the second molding elements can be spherical. By way of example, the second molding elements can be elastic such that, when pressing the contact section against the first molding body, the corresponding second molding element leaves no impression in the contact section.

The leadframe section may be provided such that it has in the second contact section at least one third molding element, in the region of which the thickness of the contact section corresponds to the thickness of the receiving section. A molding tool having a first molding body and a second molding body is used to embed the leadframe section into the molding material. The leadframe section to be embedded is arranged between the first and second molding bodies such that the first side of the leadframe section faces the first molding body and the second side of the leadframe section faces the second molding body. The first and second molding bodies are pressed together, as a result of which the third molding element presses the contact section against the first molding body. The molding material is supplied between the two molding bodies. The molding material at least partly surrounds the third molding element. The third molding element can be arranged as an alternative or in addition to the first and/or second molding element.

The third molding element can be, for example, a prominence of the contact section, wherein the prominence is formed at a second side of the contact section facing away from the contact region and, with the leadframe section inserted in the molding tool, protrudes from the contact section in the direction of the second molding body. The third molding element has the effect that the contact section, despite its smaller thickness, is pressed precisely against the first molding body during embedding such that, during embedding, no liquid molding material can penetrate between the contact section and/or the contact region and the first molding body. In this case, the molding tool and, in particular, the second molding body can be used without modification. Without the third molding element, the molding tool could not seal the contact region relative to the molding material since no counterpressure would act from the side of the second molding tool. This would lead to deposition of molding material on the contact region and/or to formation of flash, which can lead to problems in subsequent processes, for example, during contacting, for example, during wire contacting of the electronic component. The third molding element thus contributes to precise formation of the housing, for example, without molding material and/or flash on the contact region. Alternatively or additionally, the positional and/or dimensional fidelity can be improved as a result.

The third molding element may be at least partly removed, for example, after the molding material has been cured, for example, with the aid of an etching method, as a result of which an opening is formed in the molding material.

The opening, for example, one of the openings explained above, in the molding material at the second side of the contact section may be filled with electrically insulating material.

The leadframe section may be embedded into the molding material by virtue of the fact that a leadframe is embedded into the molding material, the leadframe having the leadframe section. A housing arrangement comprising a plurality of interconnected housings is formed by the embedded leadframe. After the leadframe has been embedded into the molding material the housings can be singulated from the housing arrangement. By way of example, the housing arrangement can be repeatedly severed, for example, sawn or cut, for this purpose. Before the housings are singulated, for example, the openings into the molding material can also be filled with the electrically insulating material.

A method of producing an electronic assembly is provided, wherein a housing is provided, for example, in accordance with the method explained above, and wherein an electronic component is arranged into the receiving region of the housing and is electrically coupled to the contact region. The electronic component can be inserted, for example, before or after the singulation of the housing arrangement into the corresponding component. The electronic component in the receiving opening can be embedded into potting compound, for example. The embedding of the electronic component into the potting compound can be carried out, for example, before or after the singulation of the housings.

Examples are illustrated in the figures and are explained in greater detail below.

In the following detailed description, reference is made to the accompanying drawings, which form part of this description and show for illustration purposes specific examples in which our housings and methods can be implemented. In this regard, direction terminology such as, for instance, "at the top," "at the bottom," "at the front," "at the back," "front," "rear," and the like is used with respect to the orientation of the figure(s) described. Since component parts of examples can be positioned in a number of different orientations, the direction terminology serves for illustration and is not restrictive in any way whatsoever. Other examples can be used and structural or logical changes can be made, without departing from the scope of protection of the appended claims. The features of the examples described herein can be combined with one another, unless specifically indicated otherwise. Therefore, the following detailed description should not be interpreted in a restrictive sense, and the scope of protection is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various examples, an electronic component can be a component that emits electromagnetic radiation. In various examples, a component that emits electromagnetic radiation can be a semiconductor component that emits electromagnetic radiation and/or can be a diode that emits electromagnetic radiation, as an organic diode that emits electromagnetic radiation, as a transistor that emits electromagnetic radiation or as an organic transistor that emits electromagnetic radiation. The radiation can be, for example, light in the visible range, UV light and/or infrared light. In this connection, the component that emits electromagnetic radiation can be, for example, a light emitting diode (LED), an organic light emitting diode (OLED), a light emitting transistor or an organic light emitting transistor. The light emitting component can be part of an integrated circuit. Furthermore, a plurality of light emitting components can be provided, for example, in a manner accommodated in a common housing.

Figure 1:
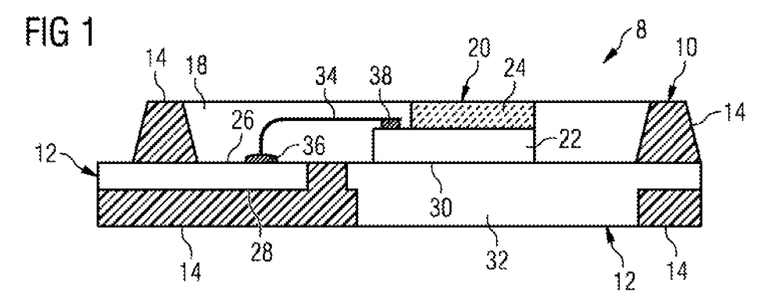
FIG. 1 shows a sectional illustration of one example of an electronic assembly.

FIG. 1 shows one example of an electronic assembly 8. The electronic assembly 8 can comprise, for example, a housing 10 for an electronic component 20 and the electronic component 20. The electronic assembly 8 can also be designated as QFN package, for example.

The housing 10 can comprise, for example, a leadframe section 12 which can be formed from electrically conductive material and a molding material 14. The electrically conductive material can comprise, for example, a metal, for example, copper, for example, CuW or CuMo, copper alloys, brass, nickel and/or iron, for example, Fe—Ni, and/or can be formed therefrom.

The leadframe section 12 can be, for example, the molding material 14 of the housing 10. The molding material 14 can comprise, for example, a thermosetting plastic, for example, epoxy resin, silicone resin, or a thermoplastic, for example, PPA or polyester, and/or an inorganic material, for example, a composite material, for example, epoxy resin, and/or silicone, a silicone hybrid and/or a silicone-epoxy hybrid.

The leadframe section 12 can have a contact section 28, for example, which can have a contact region 26 at a first side of the leadframe section 12. The leadframe section 12 can have a receiving section 32, for example, which can have a receiving region 30 at the first side of the leadframe section 12. The molding material 14 can be formed partly on the first side of the leadframe section 12, for example, such that there is formed in the molding material 14 a receiving opening 18 in which the contact region 26 and the receiving region 30 are exposed and/or in which the electronic component 20 is arranged and/or contacted.

The receiving section 32 can have, perpendicular to the first side of the leadframe section 12, a thickness greater than a thickness of the contact section 28 perpendicular to the first side of the leadframe section 12. The molding material 14 can be formed at a second side of the contact section 28, the second side facing away from the first side with the receiving region 26. An underside of the housing 10, the underside facing away from the electronic component 20 can be formed, for example, by the molding material 14 in the contact section 28 and the leadframe section 12 in the receiving section 32. The molding material 14 can be formed and/or arranged, for example, between the contact section 28 and the receiving section 32. By way of example, the molding material 14 can electrically insulate the contact section 28 from the receiving section 32. A thickness of the housing 10 can be, for example, 100 μm to 1 mm, for example, 200 μm to 500 μm, for example, 250 μm to 300 μm. A thickness of the leadframe section 12 can be, for example, 100 μm to 500 μm, for example, 150 μm to 300 μm.

The electronic component 20 can be, for example, a component that emits electromagnetic radiation. The electronic component 20 can comprise a radiation source 22, for example, which can be coupled to the receiving region 30, for example. The radiation source 22 is suitable to generate electromagnetic radiation. The radiation source 22 can have a substrate, for example, on which the electronic component parts of the radiation source 22 are arranged. The substrate can, for example, be electrically insulating and/or physically in contact with the receiving region 30. The electromagnetic radiation generated by the radiation source 22 can be used, for example, directly as useful radiation, for example, as illumination light. As an alternative thereto, the electronic component 20 can comprise a conversion element 24, for example, which can be arranged, for example, on a side of the radiation source 22 facing away from the leadframe section 12 or at a distance therefrom. The conversion element 24 can comprise phosphors, for example, which can be excited to emit converted electromagnetic radiation with the aid of the electromagnetic radiation from the radiation source 22. In this connection, the electromagnetic radiation generated by the radiation source 22 can be designated as excitation radiation and the electromagnetic radiation generated with the aid of the conversion element 24 can be designated as conversion radiation, for example.

The phosphors in the conversion element 24 can be energetically excited with the aid of the excitation radiation. During the subsequent energetic deexcitation, the phosphors emit light of one or a plurality of predefined colors. A conversion of the excitation radiation thus takes place, whereby the conversion radiation is generated. During the conversion, the wavelengths of the excitation radiation are shifted toward shorter or longer wavelengths. The colors can be individual colors or mixed colors. The individual colors can comprise green, red or yellow light, for example, and/or the mixed colors can be mixed from green, red and/or yellow light, for example, and/or comprise white light, for example. In addition, blue light can be provided, for example, by virtue of the conversion element 24 being at least partly non-converted excitation radiation leaves the electronic component 8 as usable illumination light. The individual or mixed colors can be presented with the aid of the conversion element 24 and the excitation radiation. By way of example, green, red and yellow can be presented with the aid of blue laser light. With the use of UV laser light as excitation radiation, the phosphors can also be chosen such that they present red, green, blue and yellow.

The conversion element 24 can comprise, for example, one, two or more thin phosphor layers such as cubic silicate minerals, orthosilicates, garnets or nitrides on surfaces of corresponding carriers. In this case, the phosphor layers can be mechanically fixed to binders and/or linked to an optical system (lens, collimator or the like), wherein the light coupling can be effected, for example, via air or by an immersion medium. In the applications mentioned above, the phosphors are usually excited to emission by LEDs and/or laser diodes having high light powers. The thermal losses that arise in this case should be dissipated, for example, via the carrier, the substrate and/or the leadframe section 12, in particular the receiving section 32 to avoid overheating and hence thermally governed changes in the optical properties or in the destruction of the phosphor.

The phosphors, which can be present in pulverulent form, for example, without additional use of binders, for example, silicones, cannot form mechanically stable layers, i.e., abrasion- and/or scratch-resistant layers. However, binders are also generally used to bring the phosphor particles together to form a phase which can then be applied to corresponding surfaces. With the use of binders for layer stabilization, these binders themselves can interact with the phosphors and thus influence their optical and thermal properties, and also their lifetime.

As alternatives, conversion elements 24 are known which are formed form a ceramic comprising the phosphor or from a crystal comprising the phosphor. In particular, the phosphor can form the ceramic or the crystal. Such conversion elements 24 can be adhesively bonded to heat sinks, for example, such that the heat arising therein can be dissipated. A limiting variable for the heat dissipation here may be, for example, the thermal conductivity of the adhesive used. Furthermore, it is beneficial to good heat dissipation if the conversion elements 24 are made particularly thin. A limiting variable for the thickness of the conversion element 24 may be, for example, the stability of the conversion element 24, the stability diminishing with diminishing thickness, and the required handleability when the conversion element 24 is applied to the heat sink.

The phosphor used can, for example, be embedded in the ceramic or incorporated in the crystal structure and/or in various examples, can be, for example, a phosphor mixture comprising a mixture of different phosphors, whereby light which combines a plurality of different colors can be generated, for example. The conversion element 24 can, for example, consist completely or only partly of crystal or ceramic. Furthermore, for example, the crystal conversion element can be a single crystal. Independently thereof, the conversion element 24 can comprise a matrix material, which can comprise diamond or Al2O3, for example.

Customary phosphors are, for example, garnets or nitrides silicates, nitrides, oxides, phosphates, borates, oxynitrides, sulfides, selenides, aluminates, tungstates, and halides of aluminum, silicon, magnesium, calcium, barium, strontium, zinc, cadmium, manganese, indium, tungsten and other transition metals, or rare earth metals such as yttrium, gadolinium or lanthanum, which are doped with an activator such as, for example, copper, silver, aluminum, manganese, zinc, tin, lead, cerium, terbium, titanium, antimony or europium. The phosphor may be an oxidic or (oxy)nitridic phosphor such as a garnet, orthosilicate, nitrido(alumo)silicate, nitride or nitridoorthosilicate, or a halide or halophosphate. Concrete examples of suitable phosphors are strontium chloroapatite:Eu ((Sr,Ca)5(PO4)3Cl:Eu; SCAP), yttrium aluminum garnet:cerium (YAG:Ce) or CaAlSiN3:Eu. Furthermore, the phosphor or phosphor mixture can contain, for example, particles having light-scattering properties and/or auxiliary substances. Examples of auxiliary substances include surfactants and organic solvents. Examples of light-scattering particles are gold, silver and metal oxide particles.

The electronic component 20 can be electrically contacted to the contact section 28, for example, with the aid of a bonding wire 34. By way of example, the contact section 28 can have a first contact pad 36 in the contact region 26. By way of example, the radiation source 22 can have a second contact pad 38. The first contact pad 36 and the second contact pad 38 can be contacted with one another, for example, via the bonding wire 34. In addition to the illustrated electrical contact at the second contact pad 38, the radiation source 22 can also have a second electrical contact (not illustrated), for example, with a further contact pad (not illustrated), which is contacted, for example, with a further contact section (not illustrated) of the leadframe section 12, which is not illustrated in FIG. 1.

If an electrically insulating material is used for the substrate of the radiation source 22, then the radiation source is completely electrically insulated from the receiving section. Furthermore, the contact section 28 is electrically insulated toward an underside of the housing 10 by the molding material 14. Consequently, the entire underside of the housing 10 is electrically insulated from the radiation source 22. Consequently, the housing 10 can be placed, for example, directly onto an electrically conductive heat sink, for example, such that the receiving section 32 and/or the molding material 14 in the contact section 28 are/is in physical contact with the heat sink. This brings about a particularly good thermal coupling of the housing 10 and, via the receiving section 32, also of the radiation source 22, for example to a printed circuit board and/or the heat sink.

The housing 10 can be embedded, for example, substantially as a QFN housing and/or in accordance with a QFN housing. In contrast thereto, however, the housing 10, at its underside (in FIG. 1), in the contact section 28 has no electrical connection formed by the leadframe section 12, but rather is insulated toward the underside of the housing 10 in the contact section 28. Furthermore, the electronic component 20 and thus the electronic component parts of the electronic assembly 8 can be completely electrically insulated toward the underside of the housing 10, for example, if the radiation source 22 has the substrate which is electrically insulated and coupled to the receiving region 30. As a result, when the QFN housing is placed onto the printed circuit board, only a mechanical and a thermal coupling of the QFN housing can take place. In this case, the physical contact between the housing 10 and the printed circuit board and the associated thermal coupling of the housing 10 to the printed circuit board can contribute to a very good behavior during loading resulting from thermal cycling, since the material of the printed circuit board section 12 can be adapted particularly well to the coefficients of thermal expansion of the printed circuit board and/or of a heat sink. In this case, the printed circuit board can be, for example, an FR1, FR2, FR3, FR4, FR5, CEM1, CEM2, CEM3, CEM4 or CEM5 printed circuit board, for example, a through-contacted FR4 printed circuit board.

Consequently, the use of the QFN housing having an electrically insulated underside makes it possible to arrange in the QFN housing electronic components 20 having all their electrical contacts at their top side, facing away from the printed circuit board section 12, and to arrange the QFN housing with its underside with physical contact with a heat sink, wherein the heat sink can comprise an electrically conductive material, for example. The electrical coupling of the electronic assembly 8 to the printed circuit board can then be carried out, for example, by contact sections (not illustrated in the figures) of the leadframe section 12, the thickness of the contact sections being equal to the thickness of the receiving section 32, or by wires leading outward at the top or laterally.

Figure 2:
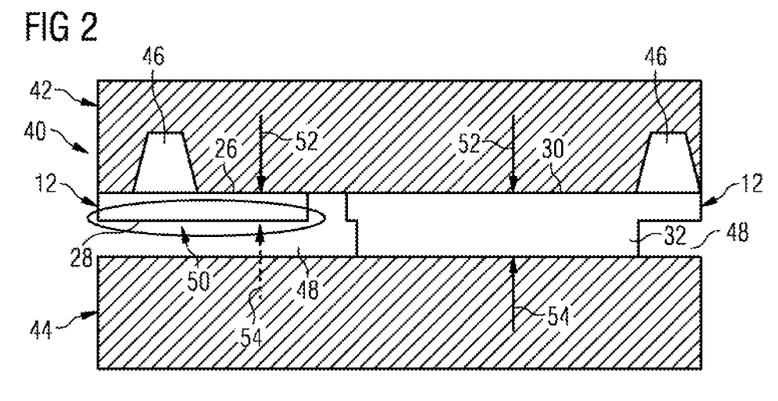
FIG. 2 shows one example of a leadframe section in a conventional molding tool.

FIG. 2 shows one example of the leadframe section 12 during a process of producing the housing 10. The leadframe section 12 can, for example, largely correspond to the leadframe section 12 explained above. The leadframe section 12 can be inserted in a molding tool 40, for example. The molding tool 40 can have, for example, a first molding body 42, which can face the first side of the leadframe section 12, and a second molding body 44, which can face the second side of the leadframe section 12. The first molding body 42 can have first cavities 46, for example, by which the receiving opening 18 is formed after the embedding process. Furthermore, second cavities 48 can be formed between the first molding body 42 and the second molding body 44.

The molding tool 40 can contribute, for example, to the embedding of the leadframe section 12 into the molding material 14. In this case, first the two molding bodies 42, 44 can be pressed together such that in a first direction 52 a pressure is exerted on the first side of the leadframe section 12 by the first molding body 42, and that in a second direction 54 a pressure is exerted on the second side of the leadframe section 12 by the second molding body 44. Liquid and/or viscous molding material 14 can then be supplied between the two molding bodies 42, 44. In this case, the molding material 14 can advance into the cavities 44, 48. The molding material 14 in the first cavities 44 can form the boundary of the receiving opening 18 and the wall thereof. The molding material 14 in the second cavities 48 can at least partly form the underside of the housing 10, the electrical insulation of the second contact section 28 toward the underside and/or the electrical insulation between the contact section 28 and the receiving section 32 by the molding material 14.

In the configuration shown in FIG. 2, however, a problem can occur during the embedding process, since the thickness of the receiving section 32 is greater than the thickness of the contact section 28. Therefore, no direct counterpressure from the second molding body 44 can act on the contact section 28 in the second direction 54 and press the contact section 28 directly against the first molding body 42. When the liquid and/or viscous molding material 14 is supplied, this can have the effect that the molding material 14, for example, on account of a capillary action and/or capillary forces, penetrates between the first molding body 42 and the contact region 26 and the first contact region 26 is partly or completely coated with molding material. This effect can also be designated as "flash," for example. This can be disadvantageous during subsequent processing processes, in particular during the electrical contacting of the electronic component 20. Furthermore, in some cases, it may be necessary that the molding material 14 must be subsequently removed from the contact region 26.

Figure 3:
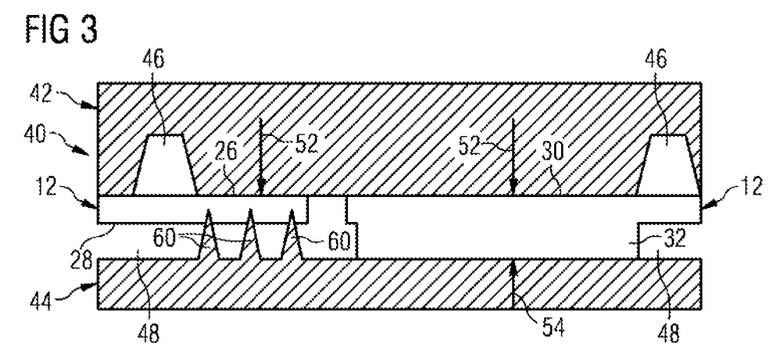
FIG. 3 shows one example of a leadframe section in one example of a molding tool.

FIG. 3 shows one example of a molding tool 40 with one example of a leadframe section 12 which may, for example, largely correspond to the molding tool 40 explained above and respectively the leadframe section 12 explained above. By way of example, the second molding body 44 can have first molding elements 60. The first molding elements 60 can be arranged in the region of the contact section 28 when the leadframe section 12 is arranged in the molding tool 40. A height of the first molding elements 60 can be greater than or equal to a difference between the thickness of the leadframe section 12 in the region of the contact section 28 and the thickness of the leadframe section 12 in the receiving section 32.

If the first molding elements 60 have a height greater than the difference between the thickness of the leadframe section 12 in the region of the contact section 28 and the thickness of the leadframe section 12 in the receiving section 32, then tolerances of the thickness of the contact section 28 or tolerances of the heights of the first molding elements 60 can be compensated for. By way of example, the first molding elements 60 can have a height such that they press the contact section 28 against the first molding body 42, for example, in every case, for example, even assuming the largest possible tolerance during the embedding process. This largely or completely prevents molding material 14 from advancing to the contact region 26 during the embedding process.

By way of example, one, two or more first molding elements 60 can be formed. By way of example, the first molding elements 60 can be arranged such that they are distributed uniformly over the contact section 28 when the leadframe section 12 is inserted in the molding tool 40. By way of example, the first molding elements 60 can have in each case a vertex or an edge at their pressure sections facing the leadframe section 12. By way of example, the first molding elements 60 can be conical, pyramidal and/or wedge-shaped. The vertex or the edge can contribute to the fact that, if the height of the first molding elements 60 is greater than the difference in thickness between the receiving section 32 and the contact section 28, the first molding elements 60 can easily deform the contact section 28 on its second side and the molding tool 40 can thus be reliably closed and pressure can be exerted uniformly on all component parts in the molding tool 40, even if the tolerances are present. When the liquid and/or viscous molding material 14 is supplied, it settles at least partly around the first molding elements 60 in the second cavity 48.

Figure 4:
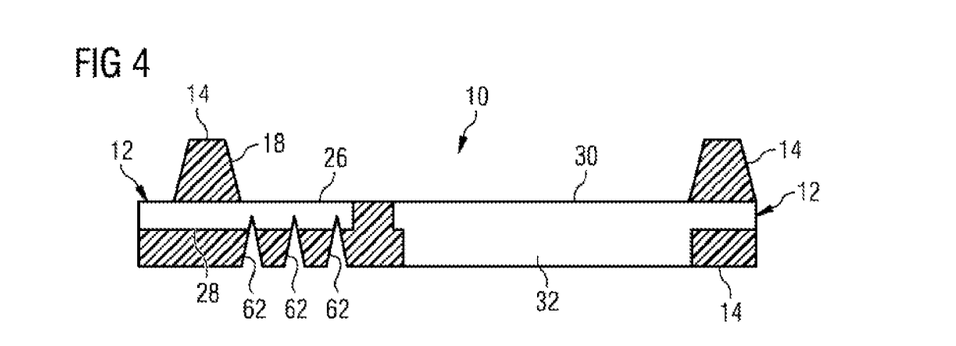
FIG. 4 shows a sectional illustration of one example of a housing for an electronic component during a production method in a first state.

FIG. 4 shows a housing 10 which can, for example, largely correspond to the housing 10 explained above, during a production process in a first state. By way of example, the housing 10 was produced using the molding tool 40 illustrated in FIG. 3. The housing 10 can have openings 62, for example, which extend from the contact section 28 toward an underside of the housing 10 and which were formed by the first molding elements 60, for example.

Figure 5:
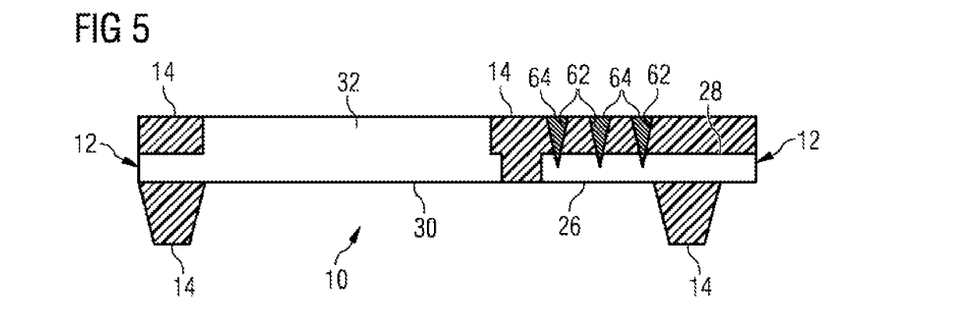
FIG. 5 shows the housing in accordance with FIG. 4 during the production method in a second state.

FIG. 5 shows the housing 10 in accordance with FIG. 4 in a second state during the production process, wherein the housing 10 was rotated by 180° such that the underside of the housing 10 and the openings 62 are directed toward the top. This enables an electrically insulating material 64 to be introduced by filling in a simple manner, such that the contact section 28 is electrically insulated toward the underside of the housing 10, which is directed toward the top in FIG. 5.

Figure 6:
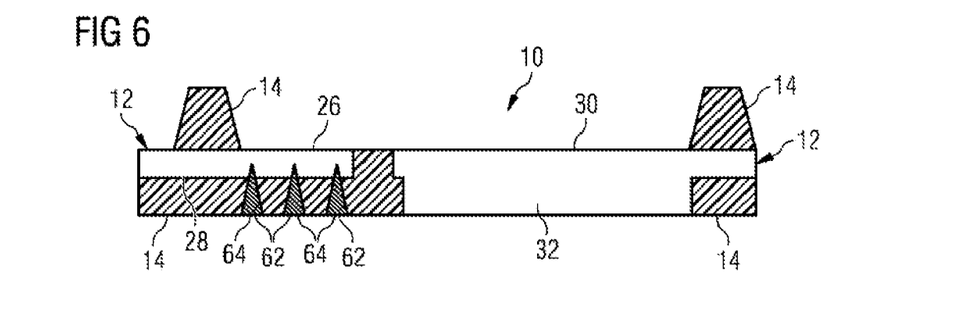
FIG. 6 shows the housing in accordance with FIGS. 4 and 5 during the production method in a third state.

FIG. 6 shows the housing 10 in accordance with FIG. 5 in a third state during the production process, wherein the housing 10 was again rotated by 180° such that the housing 10 can be supplied for a subsequent processing step. By way of example, the electronic component 20 can then be arranged in the receiving opening 18 in the receiving region 30 and/or be contacted in the contact region 26.

Figure 7:
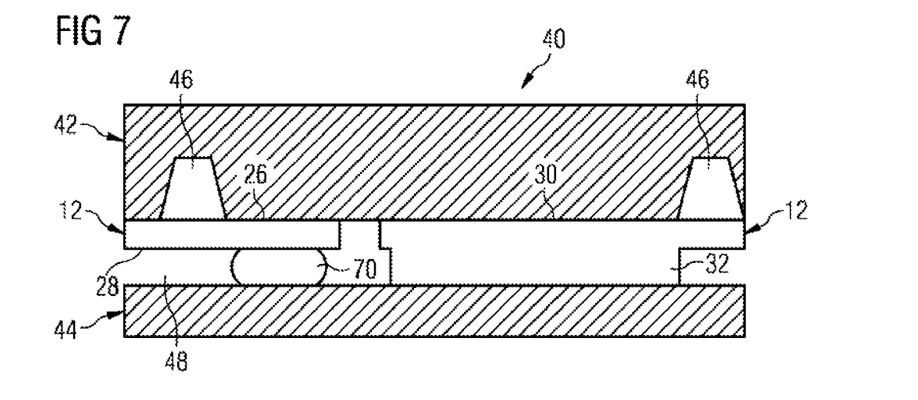
FIG. 7 shows one example of a leadframe section in a molding tool.

FIG. 7 shows one example of a molding tool 40 with one example of a leadframe section 12 which can, for example, largely correspond to the above-explained examples of the molding tool 40 and of the leadframe section 12, respectively. A second molding element 70 can be inserted between the contact section 28 and the second molding body 44. A height of the second molding element 70 from the second molding body 44 to the contact section 28, in the non-loaded state, for example, can be greater than or equal to the difference in thickness between the contact section 28 and the receiving section 32. The second molding element 70 can be elastic, for example.

When the two molding bodies 42, 44 are pressed together, a pressure is exerted on the contact section 28 by the second molding element 70 and presses the contact section 28 against the first molding body 42. This largely or completely prevents molding material 14 from advancing to the contact region 26 during the embedding process. If the second molding element 70 have a height that is greater than the difference between the thickness of the leadframe section 12 in the region of the contact section 28 and the thickness of the leadframe section 12 in the receiving section 32, then tolerances of the thickness of the contact section 28 or tolerances of the height of the second molding element 70 can be compensated for. By way of example, the second molding element 70 can have a size such that it presses the contact section 28 against the first molding body 42, for example, in every case, for example, even assuming the largest possible tolerance, during the embedding process. In addition, one, two or more further second molding bodies 42 can also be arranged. By way of example, the second molding elements 70 can be arranged such that they are distributed uniformly over the contact section 28 during the embedding process.

Figure 8:
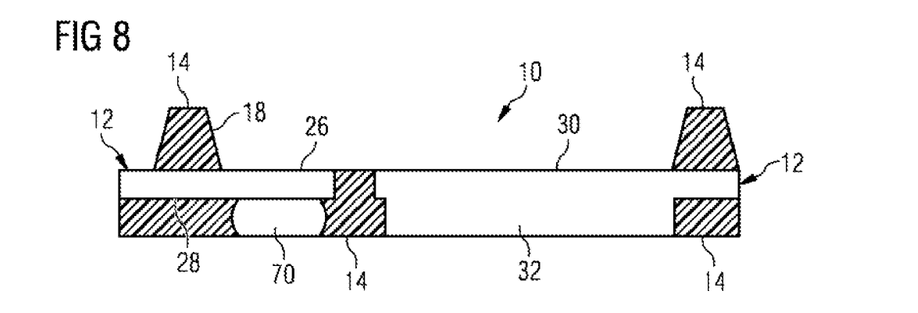
FIG. 8 shows a sectional illustration of one example of a housing for an electronic component during a production process in a first state.

FIG. 8 shows one example of a housing 10, which can largely correspond to one of the housings 10 explained above, in a first state during a production process. The housing 10 shown in FIG. 8 can be formed, for example, with the aid of the molding tool 40 shown in FIG. 7 and/or with the aid of the second molding element 70 shown in FIG. 7. By way of example, the second molding element 70 can be embedded into the molding material 14 at the contact section 28. By way of example, the second molding element 70 can be formed from an electrically insulating material and remain embedded in the molding material 14. As an alternative thereto, the second molding element 70 can be removed, as a result of which an opening arises in the contact section 28 in the molding material 14, for example, the opening 62.

Figure 9:
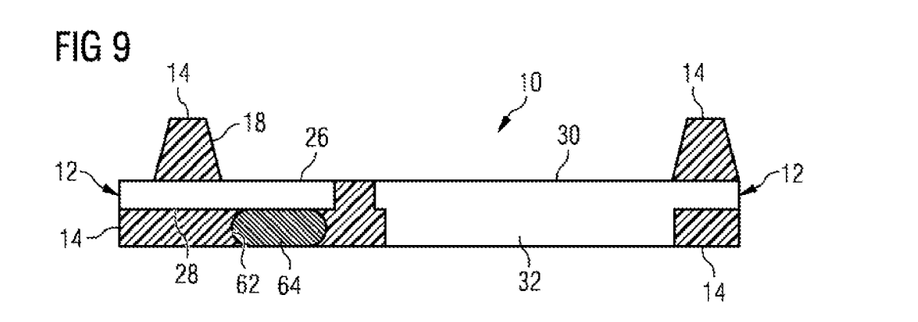
FIG. 9 shows the housing in accordance with FIG. 8 during the production process in a second state.

FIG. 9 shows the housing 10 in accordance with FIG. 8 in a second state, wherein, first, the second molding element 70 was removed and then the resultant opening 62 was filled with an electrically insulating material 64, for example, with the electrically insulating material 64 explained above. Afterward, the housing 10 can be rotated, for example, and the electronic component 20 can be arranged in the receiving region 30 and/or electrically contacted in the contact region 26.

Figure 10:
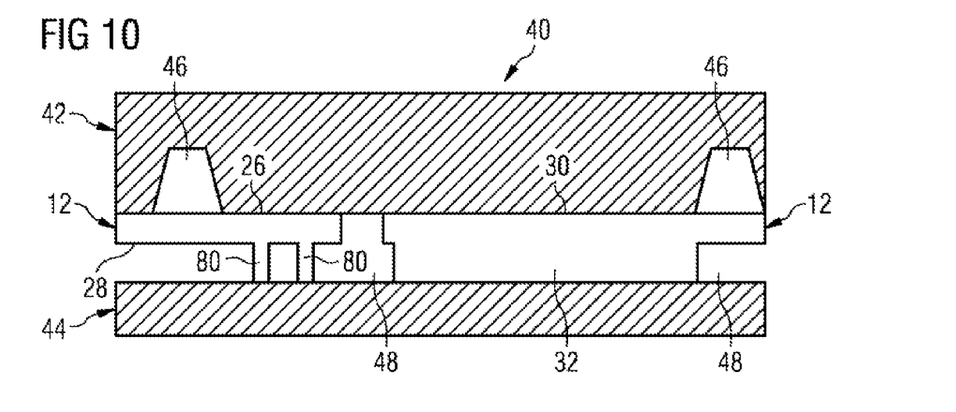
FIG. 10 shows one example of a leadframe section in a molding tool.

FIG. 10 shows one example of a molding tool 40 with one example of a leadframe section 12 which can, for example, largely correspond to the above-explained molding tool 40 and leadframe section 12, respectively. By way of example, the leadframe section 12 can have third molding elements 80 in the contact section 28. The third molding elements 80 can be formed, for example, by prominences of the contact section 28. The second contact section 28 and the third molding elements 80 together have a thickness corresponding to the thickness of the receiving section 32. With the molding tool 40 closed, the third molding elements 80 bear against the second molding body 44 and press the contact section 28 with the contact region 26 thereof against the first molding body 42 during the embedding process. This largely or completely prevents molding material 14 from advancing to the contact region 26 during the embedding process.

Figure 11:
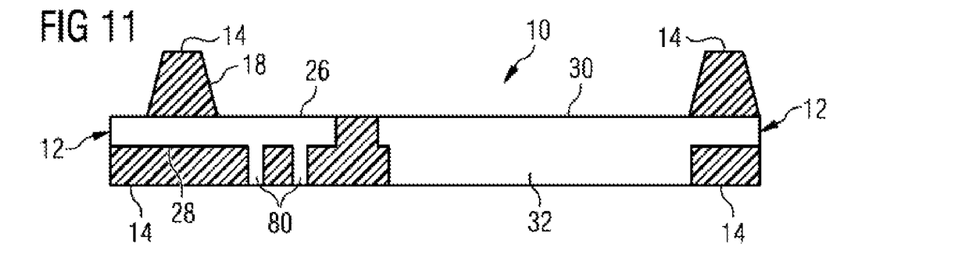
FIG. 11 shows one example of a housing for an electronic component during a production process in a first state.

FIG. 11 shows one example of a housing 10, which can largely correspond to one of the above-explained examples of the housing 10, in a first state during a production process. By way of example, the housing 10 in accordance with FIG. 11 can have the leadframe section 12 with the third molding elements 80 as shown in FIG. 10 and/or can be produced with the aid of the molding tool 40 shown in FIG. 10. The molding material 14 surrounds the third molding elements 80 in a direction parallel to the underside of the housing 10. The ends of the third molding elements 80 facing away from the contact section 28 are only scarcely covered or not covered at all by the molding material 14 and are thus exposed.

Figure 12:
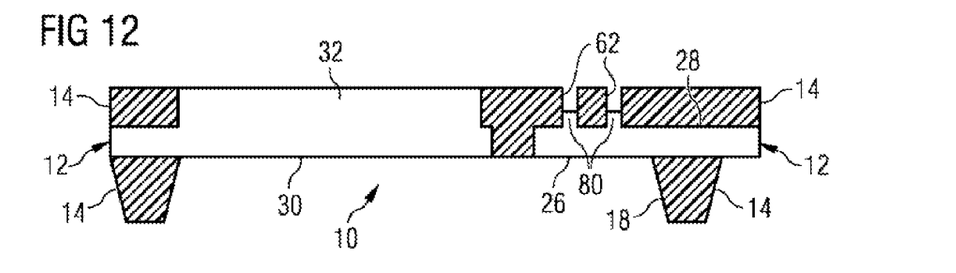
FIG. 12 shows the housing in accordance with FIG. 11 during the production process in a second state.

FIG. 12 shows the housing 10 in accordance with FIG. 11 in a second state. The housing 10 in FIG. 11 is rotated by 180° with respect to the housing 10 in FIG. 11 such that in FIG. 12 the top side of the housing 10 is at the bottom and the underside of the housing 10 is at the top. The third molding elements 80 can be at least partly removed, for example, with the aid of an etching process. The removed third molding elements 80 can leave behind openings which can be formed in the molding material 14, for example, the openings 62.

Figure 13:
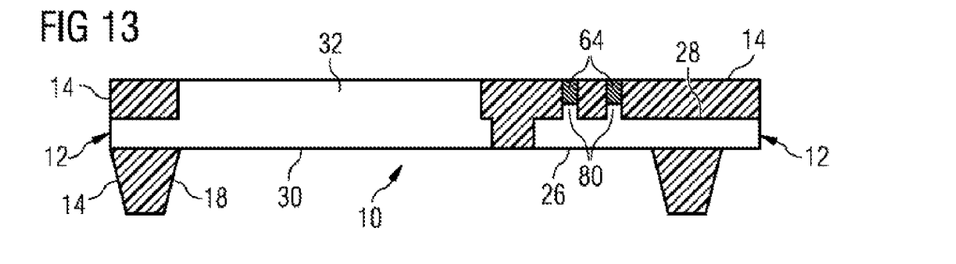
FIG. 13 shows the housing in accordance with FIGS. 11 and 12 during the production process in a third state.

FIG. 13 shows the housing 10 in accordance with FIGS. 11 and 12 in a third state, wherein the openings 62 can be filled at least partly, for example, completely with electrically insulating material, for example, the electrically insulating material 64 explained above. The electrically insulating material 64 can have the effect, for example, that the housing 10 is completely electrically insulated at its underside in the contact section 28, the underside of the housing 10 being oriented toward the top in FIG. 13. Afterward, the housing 10 can be rotated, for example, and the electronic component 20 can be arranged in the receiving region 30 and/or electrically contacted in the contact region 26.

Figure 14:
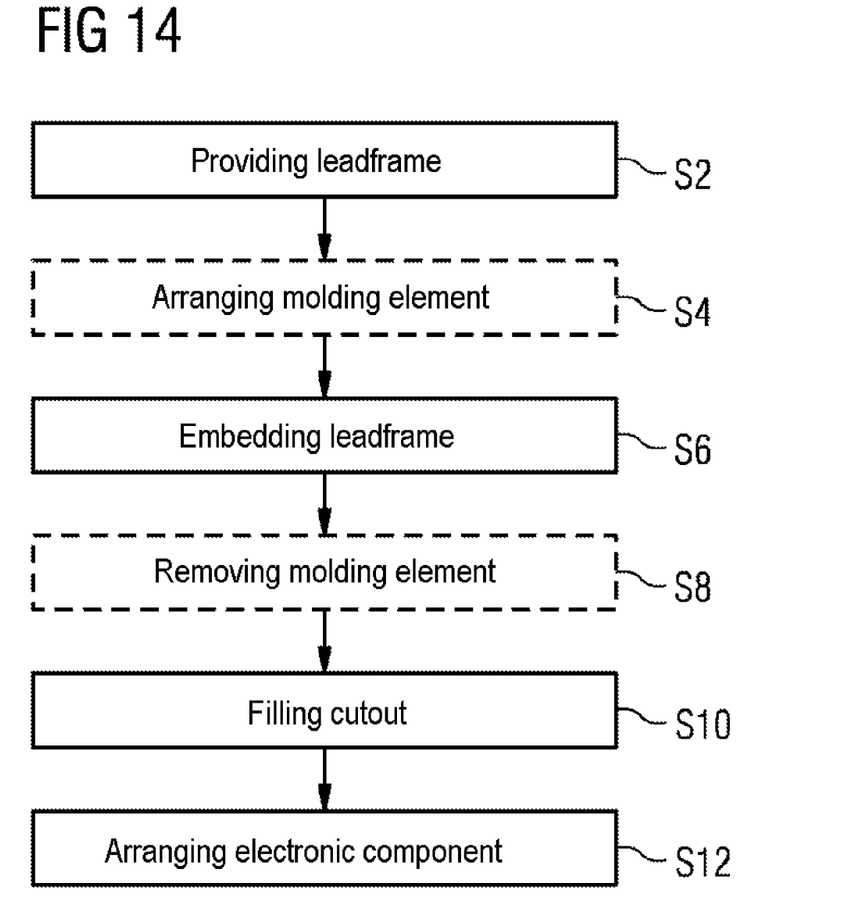
FIG. 14 shows a flow diagram of one example of a method of producing an electronic assembly.

FIG. 14 shows a flow diagram of one example of a method of producing an electronic assembly, for example, the electronic assembly 8 explained above, and/or a method of producing a housing for the electronic assembly 8, for example, one of the housings 10 explained above.

In a step S2, for example, a leadframe can be provided. The leadframe can comprise or be formed from, for example, an electrically conductive material, for example, the material explained above in association with the leadframe section 12. The leadframe can have a plurality of leadframe sections, for example, a plurality of the leadframe sections 12 explained above. The leadframe having the leadframe sections 12 can be produced from a leadframe blank, for example, by one, two or more etching processes. If appropriate, the third molding elements 80 can also be formed during the etching process(es).

In a step S4, if appropriate, the second molding element 70 can be arranged between the second molding body 44 and the contact sections 28 of the leadframe sections 12.

In a step S6, the leadframe can be embedded, for example, into molding material, for example, into the molding material 14 explained above. For the purpose of embedding the leadframe, the leadframe with its leadframe sections 12 is introduced into a molding tool, for example, one of the molding tools 40 explained above. Optionally, the leadframe sections 12 can be arranged such that the first molding elements 60 and/or the second molding element or elements 70 and/or the third molding elements 80 press the contact sections 28 against the first molding body 42 when the molding tool 40 is closed. The molding material 14 is supplied to the molding tool 40 in a liquid or viscous state, such that the cavities 46, 48 are filled with the molding material 14. The molding material 14 can subsequently be dried and/or cured.

In an optional step S8, if the second molding element 70 was arranged, the second molding element 70 can be removed again. As an alternative thereto, it is possible for the second molding element 70 not to be removed.

In a step S10, the openings 62 are at least partly, for example, completely filled with the electrically insulating material 64. The electrically insulating material 64 can comprise molding material, for example.

A housing arrangement comprising many housings 10 is formed in steps S2 to S10. The individual housings 10 can then be singulated from the housing arrangement, for example, by sawing or cutting. The method of producing the housing 10 can be concluded as a result. In other words, steps S2 to S10 can represent the method of producing the housing 10.

Before or after the singulation of the housings 10, in a step S12, for example, one, two or more electronic components 20 can be arranged and/or contacted in the housings 10. The housing 10 with the electronic component 20 constitutes the electronic assembly 8. Steps S2 to S12 can thus represent the method of producing the electronic assembly 8.

Optionally, after arranging the electronic component 20, it is possible for the receiving opening 18 to be completely or partly filled with a potting compound, for example, $TiO_2$, into which the electronic component and/or its electrical contacts are embedded.

Our housings and methods are not restricted to the examples indicated. By way of example, in each of the examples, more or fewer of the molding elements can be arranged. Furthermore, different types of molding elements can be combined with one another. By way of example, the contact section 28 can be pressed against the first molding body 42 with the aid of the first, second and/or third molding element 60, 70, 80. Furthermore, the molding elements can also be used in the case of housings for electronic components which are not QFN housings within the meaning of this application. For example, in the case of housings in which the electrical contacts project laterally from the housing. Furthermore, the above-explained leadframes and/or the third molding elements can also be produced by stamping from a leadframe blank instead of the etching process or processes.

The invention claimed is:

1. A housing for an electronic component comprising:
a leadframe section formed from an electrically conductive material has a first side and a second side facing away from the first side, a contact section having a contact region that electrically contacts the electronic component at the first side, and at least one receiving section having a receiving region that arranges the electronic component at the first side, wherein the contact section and the receiving section are physically separated from one another and wherein the contact section is formed such that it is thinner than the receiving section in a direction perpendicular to the first side,
a molding material having a receiving opening, the receiving region and the contact region being exposed in said receiving opening, and into which the leadframe section is embedded such that a part of the molding material is formed between the contact section and the receiving section and the second side of the leadframe section is covered by the molding material in the region of the contact section, and the second side of the leadframe section is free of molding material in the region of the receiving section,
wherein the molding material at the second side of the leadframe section in the region of the contact section has at least one opening filled with an electrically insulating material.

2. The housing as claimed in claim 1, wherein the molding material at the second side of the leadframe section in the region of the contact section and the leadframe section at the second side of the leadframe section in the region of the receiving section form a planar area.

3. The housing as claimed in claim 1, wherein the opening is partly filled with a molding element of the contact section and partly with the electrically insulating material.

4. An electronic assembly comprising an electronic component and comprising a housing as claimed in claim 1, wherein the electronic component is arranged on the receiving region and is electrically coupled to the contact region.

5. A method of producing a housing for an electronic component comprising:
providing a leadframe section having a first side and a second side facing away from the first side, a contact section having a contact region that electrically contacts the electronic component at the first side, and at least one receiving section having a receiving region that arranges the electronic component at the first side, wherein the contact section and the receiving section are physically separated from one another and wherein the contact section is formed such that it is thinner than the receiving section in a direction perpendicular to the first side,
embedding the leadframe section into a molding material such that the molding material has a receiving opening, in which the receiving region and the contact region remain free of molding material, but a part of the molding material is formed between the contact section and the receiving section and the second side of the leadframe section is covered by the molding material in the region of the contact section, and the second side of the leadframe section remains free of molding material in the region of the receiving section, wherein
- a molding tool having a first molding body and a second molding body is used to embed the leadframe section into the molding material,
- the leadframe section to be embedded is arranged between the first and second molding bodies such that the first side of the leadframe section faces the first molding body and the second side of the leadframe section faces the second molding body, the second molding body in the region of the contact section has at least one first molding element, the height of which is greater than or equal to a difference between the thickness of the leadframe section in the contact region and the thickness of the leadframe section in the receiving section,
- the first and second molding bodies are pressed together as a result of which the first molding element presses the contact section against the first molding body,
- the molding material is supplied between the two molding bodies, and
- an opening is formed in the molding material by the first molding element.

6. The method as claimed in claim 5, wherein the molding material is formed such that the molding material at the second side of the leadframe section in the region of the contact section and the leadframe section at the second side in the receiving section form a planar area.

7. The method as claimed in claim 5, wherein the height of the molding element is greater than the difference between the thickness of the leadframe section in the contact section and the thickness of the leadframe section in the receiving section, and wherein, when the two molding bodies are pressed together, the contact section at the second side of the leadframe section is deformed by the first molding element.

8. The method as claimed in claim 5, wherein the opening is filled with an electrically insulating material.

9. The method as claimed in claim 5, wherein the leadframe section is embedded into the molding material by embedding a leadframe into the molding material, said leadframe having the leadframe section and further leadframe sections, as a result of which a housing arrangement is formed and, wherein, after the leadframe has been embedded into the molding material, a plurality of housings are singulated from the housing arrangement.

10. A method of producing an electronic assembly, wherein a housing is produced as claimed in claim 5, and wherein an electronic component is arranged in the receiving region and is electrically coupled to the contact region.

* * * * *

UNITED STATES PATENT AND TRADEMARK OFFICE
CERTIFICATE OF CORRECTION

PATENT NO. : 9,515,015 B2  
APPLICATION NO. : 14/423835  
DATED : December 6, 2016  
INVENTOR(S) : Gebuhr et al.

Page 1 of 1

It is certified that error appears in the above-identified patent and that said Letters Patent is hereby corrected as shown below:

On the Title Page

Item (72), Line 1, change "Regenburg" to --Regensburg--.

Signed and Sealed this  
Seventh Day of March, 2017

Michelle K. Lee  
*Director of the United States Patent and Trademark Office*